United States Patent
Schwartz et al.

(10) Patent No.: US 9,024,643 B2
(45) Date of Patent: May 5, 2015

(54) SYSTEMS AND METHODS FOR DETERMINING TYPES OF USER INPUT

(75) Inventors: Adam Schwartz, Redwood City, CA (US); Joel Jordan, Sunnyvale, CA (US); Tom R. Vandermeijden, Los Gatos, CA (US); Petr Shepelev, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 287 days.

(21) Appl. No.: 13/536,755

(22) Filed: Jun. 28, 2012

(65) Prior Publication Data

US 2014/0002114 A1  Jan. 2, 2014

(51) Int. Cl.
*G06F 3/041* (2006.01)
*G06F 3/044* (2006.01)
*H03K 17/96* (2006.01)

(52) U.S. Cl.
CPC .............. *H03K 17/962* (2013.01); *G06F 3/044* (2013.01); *H03K 2217/960705* (2013.01)

(58) Field of Classification Search
None
See application file for complete search history.

(56) References Cited

U.S. PATENT DOCUMENTS

| | | | |
|---|---|---|---|
| 6,492,979 B1 | 12/2002 | Kent et al. | |
| 7,777,732 B2 | 8/2010 | Herz et al. | |
| 8,400,502 B2 * | 3/2013 | Zakrzewski et al. | 348/122 |
| 8,570,053 B1 * | 10/2013 | Ryshtun et al. | 324/678 |
| 8,723,841 B2 * | 5/2014 | Ishizaki et al. | 345/178 |
| 2008/0079699 A1 | 4/2008 | Mackey | |
| 2009/0006958 A1 * | 1/2009 | Pohjola et al. | 715/710 |
| 2009/0231282 A1 | 9/2009 | Fyke | |
| 2010/0164889 A1 | 7/2010 | Hristov et al. | |
| 2010/0231553 A1 | 9/2010 | Yabuuchi et al. | |
| 2010/0253651 A1 | 10/2010 | Day | |
| 2010/0292945 A1 | 11/2010 | Reynolds et al. | |
| 2010/0327989 A1 * | 12/2010 | Abbott et al. | 333/1 |
| 2012/0146938 A1 | 6/2012 | Worfolk et al. | |
| 2012/0146939 A1 | 6/2012 | Worfolk et al. | |
| 2012/0200524 A1 * | 8/2012 | Vallis et al. | 345/174 |
| 2013/0307823 A1 * | 11/2013 | Grivna et al. | 345/174 |

OTHER PUBLICATIONS

International Searching Authority, International Search Report and Written Opinion for International Application No. PCT/US2013/048109, mailed Oct. 18, 2013.

* cited by examiner

*Primary Examiner* — Arleen M Vazquez
*Assistant Examiner* — Feba Pothen
(74) *Attorney, Agent, or Firm* — Osha Liang LLP

(57) ABSTRACT

The embodiments described herein thus provide devices and methods that facilitate improved input devices. Specifically, the devices, systems and methods provide the ability to accurately determine user input using multiple different sensing regimes. The different sensing regimes can be used to facilitate accurate position determination of objects both at the surface and away from the surface. For example, the different sensing regimes can be used to determine position information for both ungloved and gloved fingers. In one embodiment the first sensing regime uses a first duty cycle of absolute capacitive sensing and a first duty cycle of transcapacitive sensing. The second sensing regime uses a second duty cycle of absolute capacitive sensing and a second duty cycle of transcapacitive sensing, where the second duty cycle of absolute capacitive sensing is greater than the first duty cycle of absolute capacitive sensing.

20 Claims, 5 Drawing Sheets

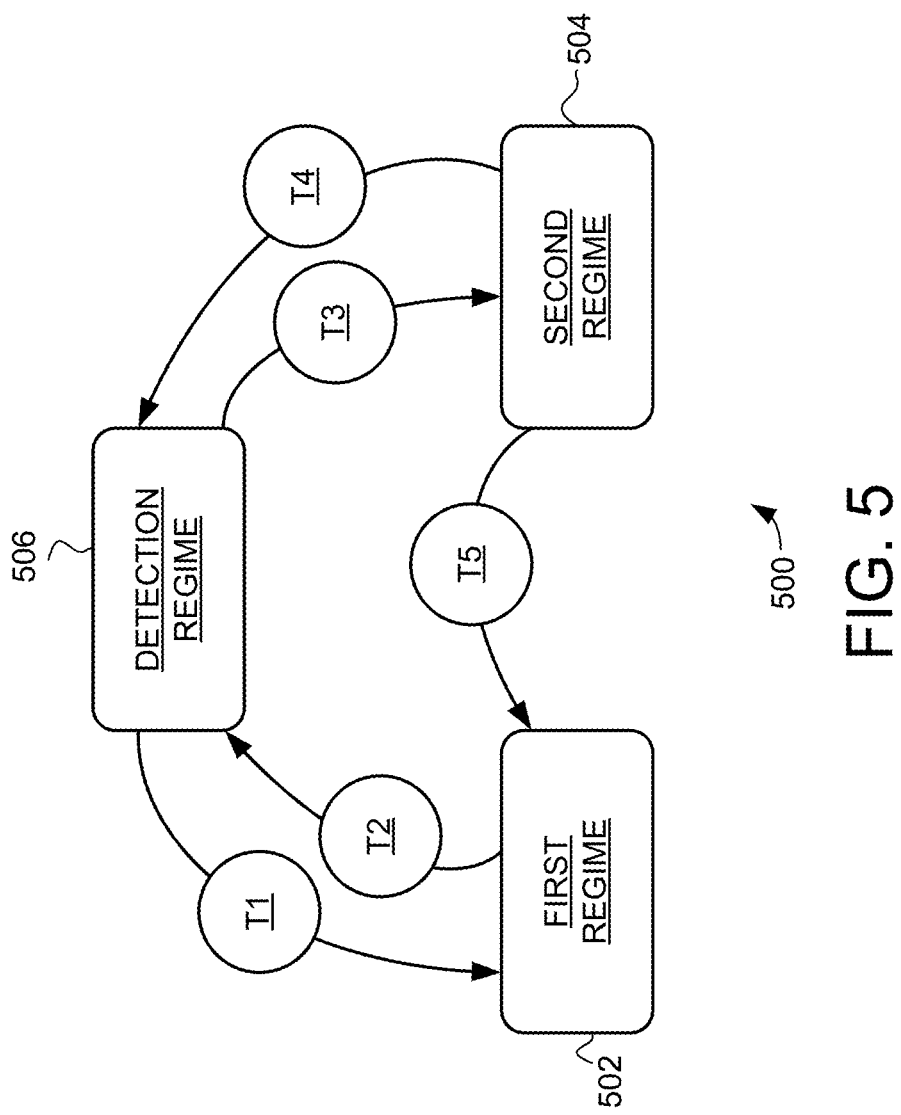

SYSTEMS AND METHODS FOR DETERMINING TYPES OF USER INPUT

FIELD OF THE INVENTION

This invention generally relates to electronic devices, and more specifically relates to input devices.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers).

Proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

One issue with some past input devices is that the some proximity sensor devices are limited to reliably receiving input with objects that are at or very near the surface. Specifically, some proximity sensor devices can accurately determine location and/or motion of objects that are either right at the surface, or very near to the surface. However, when the objects are farther away from the surface the device the accuracy degrades, and most devices cannot reliably respond to such objects, and thus simply ignore such objects.

This is of particular issue when users try and use input devices while wearing gloves. Some gloves prevent the finger of the user from getting close enough to have the position of the finger reliably detected. The extent that gloves interfere with use will generally depend on the thickness and dielectric properties of the glove. The thicker the glove, and the lower a dielectric constant of the glove, the more likely that the presence or position of the gloved finger will not be reliably detected.

Thus, there exists a need for improvements in proximity sensor device that improves device flexibility and usability. Other desirable features and characteristics will become apparent from the subsequent detailed description and the appended claims, taken in conjunction with the accompanying drawings and the foregoing technical field and background.

BRIEF SUMMARY OF THE INVENTION

The embodiments of the present invention provide devices and methods that facilitate improved input devices. Specifically, the devices, systems and methods provide the ability to accurately determine user input using multiple different sensing regimes. The different sensing regimes can be used to facilitate accurate detection and position determination of different types of objects both at the sensing surface and away from the sensing surface. For example, the different sensing regimes can be used to determine position information for both ungloved and gloved fingers, and fingers hovering above the sensing surface. As another example, the different sensing regimes can be used to accurately determine position information for both touching and hovering input objects.

In one embodiment, a processing system for an input device comprises a sensor module and a determination module. The sensor module is configured to operate a plurality of capacitive sensor electrodes to selectively perform transcapacitive sensing and absolute capacitive sensing to detect input objects in a sensing region. The determination module is configured to determine positional information for input objects in the sensing region by selectively operating the processing system in a first sensing regime and a second sensing regime based on contact information for input objects in the sensing region. In this embodiment the first sensing regime uses a first duty cycle of absolute capacitive sensing and a first duty cycle of transcapacitive sensing. The second sensing regime uses a second duty cycle of absolute capacitive sensing and a second duty cycle of transcapacitive sensing, where the second duty cycle of absolute capacitive sensing is greater than the first duty cycle of absolute capacitive sensing.

In another embodiment, an input device comprises a touch surface, a plurality of capacitive sensor electrodes and a processing system. The processing system is coupled to the plurality of capacitive sensor electrodes and is configured to perform both transcapacitive sensing between electrodes in the plurality of capacitive sensor electrodes and perform absolute capacitive sensing between electrodes in the plurality capacitive sensor electrodes and an input object a sensing region of the input device. The processing system is further configured to selectively operate in a first sensing regime and a second sensing regime based on contact information for input objects in the sensing region, where the first sensing regime comprises a first duty cycle of absolute capacitive sensing and a first duty cycle of transcapacitive sensing, the second sensing regime comprises a second duty cycle of absolute capacitive sensing and a second duty cycle of transcapacitive sensing, where the second duty cycle of absolute capacitive sensing is greater than the first duty cycle of absolute capacitive sensing. The processing system is further configured to determine positional information for input objects in the sensing region using at least one of the first sensing regime and the second sensing regime.

In any of these and other embodiments the providing of two sensing regimes with different duty cycles of absolute capacitive sensing and transcapacitive sensing can be used to facilitate accurate position determination of input objects both at the surface and away from the surface. For example, by providing a first sensing regime with a smaller duty cycle of absolute capacitive sensing and a larger duty cycle of transcapacitive sensing, the processing system can facilitate accurate position determination for objects that are at the surface, such as fingers touching the surface. Likewise, by providing a second sensing regime with a larger duty cycle of absolute capacitive sensing and a smaller duty cycle of transcapacitive sensing, the processing system can facilitate position determination for objects that are away from a surface, such as hovering fingers.

Such devices and methods can thus be used to reliably receive input from both objects that are at or very near the touch surface, and objects that are farther away from the surface, such as gloved fingers. Thus, the devices, systems and methods can improve both the flexibility and usability of such devices.

BRIEF DESCRIPTION OF DRAWINGS

The preferred exemplary embodiment of the present invention will hereinafter be described in conjunction with the appended drawings, where like designations denote like elements, and:

FIG. 5 is a state diagram illustrating transitions between sensing regimes in accordance with an embodiment of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Figure 1:
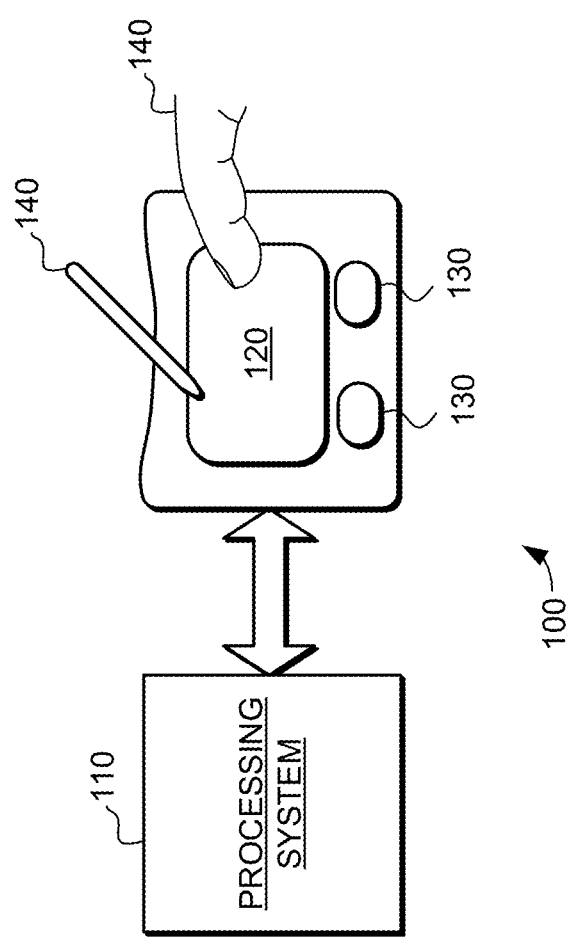
FIG. 1 is a block diagram of an exemplary system that includes an input device in accordance with an embodiment of the invention.

Various embodiments of the present invention provide input devices and methods that facilitate improved usability. FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with a touch surface (e.g. a surface configured to receive input touch) of the input device 100, contact with an touch surface of the input device 100 coupled with some amount of applied force or pressure, and/or a combination thereof. In various embodiments, touch surfaces may be provided by surfaces of casings within which sensor electrodes reside, by face sheets applied over the sensor electrodes or any casings, etc. In some embodiments, the sensing region 120 has a rectangular shape when projected onto a touch surface of the input device 100.

The input device 100 utilizes capacitive sensing to detect user input in the sensing region 120. To facilitate capacitive sensing, the input device 100 comprises one or more sensing electrodes for detecting user input.

Some implementations are configured to provide images that span one, two, three, or higher dimensional spaces. Some implementations are configured to provide projections of input along particular axes or planes. In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

In accordance with the embodiments described herein, the input device is configured to utilize both "absolute capacitance" and "transcapacitive" sensing methods. Absolute capacitance sensing methods, sometimes referred to as "self capacitance", are based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Transcapacitive sensing methods, sometimes referred to as "mutual capacitance", are based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, as described above, the processing system 110 may include the circuit components for selectively performing absolute capacitive sensing by modulating capacitive sensor electrodes with respect to a reference voltage. Furthermore, the processing system 110 may include the circuit components for transmitting signals with transmitter sensor electrodes, and receiving signals with receiver sensor electrodes to selectively perform transcapacitive sensing.

In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s). In accordance with the embodiments described herein, the sensor module may be configured to operate a plurality of capacitive sensor electrodes to selectively perform transcapacitive sensing and absolute capacitive sensing to detect input objects in a sensing region. A further example includes determination modules, where the determination module is configured to determine positional information for input objects in the sensing region by selectively operating the processing system in a first sensing regime and a second sensing regime based on contact information for input objects in the sensing region. In this embodiment the first sensing regime uses a first duty cycle of absolute capacitive sensing and a first duty cycle of transcapacitive sensing. The second sensing regime uses a second duty cycle of absolute capacitive sensing and a second duty cycle of transcapacitive sensing, where the second duty cycle of absolute capacitive sensing is greater than the first duty cycle of absolute capacitive sensing.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like. In one embodiment, processing system 110 includes a determination module configured to determine positional information for an input device based on the measurement.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Turning now to FIG. 2, examples of objects at and away from a sensitive surface are illustrated schematically. Specifically, FIG. 2A shows an example of a user's finger 202 at the input or touch surface 200 of an input device. Likewise, FIG. 2B shows an example of the user's finger 202 away from the touch surface 200, as would occur when a user "hovers" the finger some distance above the touch surface 200. FIG. 2C shows an example of a user's finger 202 inside a glove 204. In this case, while the glove 204 is touching the surface 200, the finger 202 does not. Because typical gloves are non-conductive and largely filed with air having a low dielectric constant, the capacitive effects of a gloved finger such as that in FIG. 2C are more similar to a hovering finger like that of the hovering finger in FIG. 2B than that of a contacting finger, like in FIG. 2A. Finally, FIG. 2D shows an example of a user's finger 202 contacting the touch surface with a finger nail. In this case, the conductive portion of the finger appears to hover above the touch surface, like in FIG. 2B, while actually making contact with the touch surface with the finger nail. The capacitive effects of a finger such as that in FIG. 2D are more similar to a hovering finger like that of the hovering finger in FIG. 2B than that of a contacting finger, like in FIG. 2A.

As described above, in many cases fingers and other conductive objects that are away from the surface may not be reliably detected for position determination. Specifically, many implementations of capacitive sensing, including typical implementations of transcapacitive sensing, have limited range to capacitively detect objects away from the surface. In general, because transcapacitive sensing uses signals transmitted between electrodes, the capacitive changes caused by a finger a significant distance away from the surface (such as a gloved finger) may be below the level that can be reliably detected. This limited range may be caused by several factors, including the size and location and excitation ordering and grouping of the electrodes, the strength of the transmitted and received signals, the type of sensing used, receiver gain, threshold and baseline levels used, and types of signal filtering used. Specifically, when these various factors are implemented to optimize for position determination of objects at the surface, these same factors may inhibit the accurately of input objects away from the surface.

For these reasons, the embodiments described herein provide multiple sensing regimes, with the sensing regimes having different abilities to reliably detect objects at the surface (a first portion of the sensing region) and away from the surface (a second portion of the sensing region). For example, different sensing regimes may be enabled by having different usages of transcapacitive and absolute capacitive sensing, different touch thresholds, different receiver gain, different filtering, different baseline acquisition and use, different processing of resulting signals, etc. In some embodiments, different sensing regimes are used based on contact information for input objects in the sensing region provided by a contact sensor.

Figure 2A:
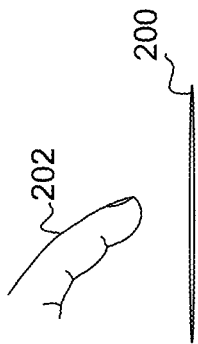
FIG. 2 are schematic views of exemplary fingers at a touch surface and away from the touch surface.
Figure 2B:
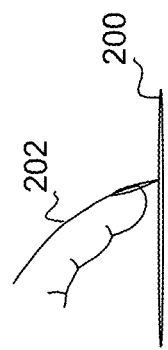
Figure 2C:
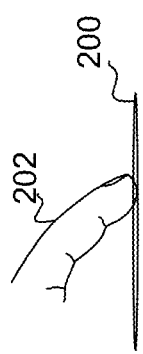
Figure 2D:
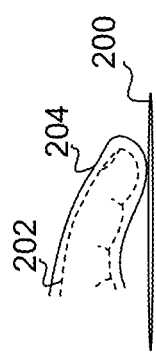

Finally, it should be noted that in FIG. 2A the conductive portion of the user's finger 202 is in a first portion of the sensing region nearest the surface 200. In contrast, in FIGS. 2B-2D the conductive portion of the user's finger is in a second portion of the sensing region, where the second portion of the sensing region extends further from the touch surface 200. The extent of these regions will depend on the implementation of the various sensing regimes, and there is no requirement for any specific or defined boundary between the first and second portions.

Returning now to FIG. 1, in accordance with various embodiments of the invention, the processing system 110 is configured to operate the input device 100 in multiple sensing regimes comprising different duty cycles of absolute capacitive sensing and transcapacitive sensing that can be used to facilitate accurate detection and position determination of objects both at the surface and away from the surface. Specifically, the processing system 110 of the input device 100 is communicatively coupled to a plurality of capacitive sensor electrodes (not shown in FIG. 1). The processing system 110 is configured to perform both transcapacitive sensing between electrodes in the plurality of capacitive sensor electrodes and perform absolute capacitive sensing between electrodes in the plurality capacitive sensor electrodes and an input object the sensing region 120 of the input device 100.

The processing system 110 is further configured to selectively operate in a first sensing regime and a second sensing regime. In general, the first sensing regime is adapted to determine position information for objects at the surface of the input device 100 (the first portion of the sensing region), while the second sensing regime is adapted to determine position information for objects that are away from the surface (the second portion of the sensing region), such as gloved or hovering fingers. To facilitate this, the first sensing regime comprises a first duty cycle of absolute capacitive sensing and a first duty cycle of transcapacitive sensing, the second sensing regime comprises a second duty cycle of absolute capacitive sensing and a second duty cycle of transcapacitive sensing, where the second duty cycle of absolute capacitive sensing is greater than the first duty cycle of absolute capacitive sensing. The processing system 110 is further configured to determine positional information for input objects in the sensing region using the first sensing regime and the second sensing regime.

In such embodiments, the providing of two sensing regimes with different duty cycles of absolute capacitive sensing and transcapacitive sensing can be used to facilitate accurate position determination of objects both at the surface and away from the surface. In general, transcapacitive sensing provides the ability to reliably and accurately determine position information for multiple objects simultaneously in the sensing region, but it usually has a more limited sensing range. In contrast, absolute capacitive sensing can provide a more dynamic sensing range, but with less accuracy and ability to determine position of multiple objects simultaneously. Thus, by providing a first sensing regime with a smaller duty cycle of absolute capacitive sensing and a larger duty cycle of transcapacitive sensing, the processing system 110 can facilitate accurate position determination for objects, including multiple objects that are at the surface, such as input object touching or near the surface. Likewise, by providing a second sensing regime with a larger duty cycle of absolute capacitive sensing and a smaller duty cycle of transcapacitive sensing, the processing system 110 can facilitate position determination for objects that further away from the surface. The second sensing regime can also be used to facilitate position determination for fingers that are hovering, such as a finger touching the surface only with the nail such that the fingertip is some distance from the surface.

In some embodiments other features may differentiate the first sensing regime and the second sensing regime. Like the relative duty cycles mentioned above, these other features may provide increased performance for input objects at the surface when using the first sensing regime, while also providing increased performance for input objects away from the surface when using the second sensing regime. As specific examples, the different sensing regimes can utilize different filtering, baseline and sensitivity thresholds. As other examples, the sensing regimes can utilize different electrode excitation schemes. As a final example, the different sensing regimes can utilize different techniques for determining positional information from measured sensor values.

In some embodiments, the processing system may be configured to operate in different sensing regimes or to modify operation of a sensing regime based on contact information for input objects in the sensing region. The contact information may be determined using the sensor electrodes alone or in combination with contact sensors communicatively coupled to the processing system. For example, resulting signals received from the sensor electrodes may be determined to show an input object in contact with the sensing surface. In some embodiments, another sensing system (e.g. an optical or force sensor) may provide an indication that an input object is making contact with the touch surface of the input device. As a result the processing system may modify or select a sensing regime to better detect the input object based on the contact information from at least one of the resulting signals from the sensor electrodes and the contact sensor.

Figure 3:
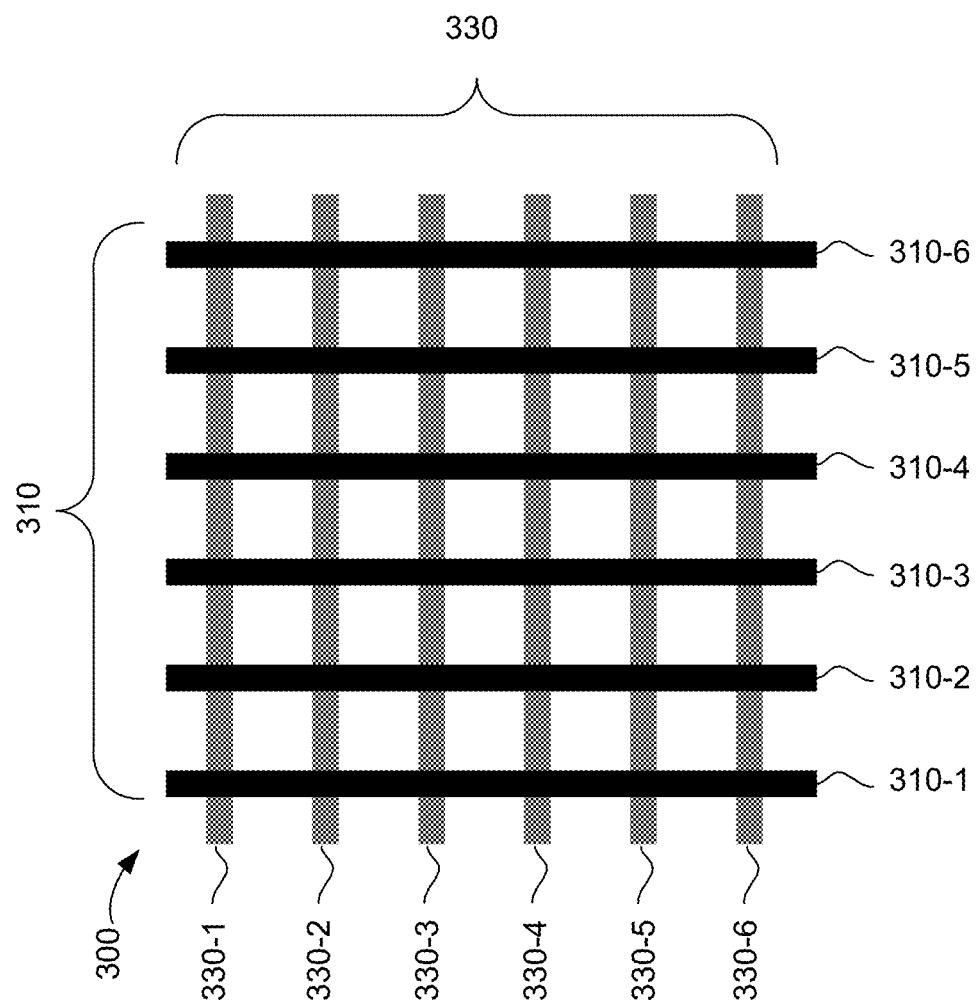
FIG. 3 is a block diagram of sensor electrodes in accordance with an exemplary embodiment of the invention.

Turning now to FIG. 3, this figure conceptually illustrates an exemplary set of capacitive sensor electrodes 300 configured to sense input objects in a sensing region. For clarity of illustration and description, FIG. 3 shows a pattern of sensor electrodes illustrated as simple rectangles; however, it will be appreciated that the invention is not so limited, and that a variety of electrode patterns may be suitable in any particular embodiment. In one embodiment, the sensor electrodes 310 and 330 are configured to operate using both absolute sensing techniques and transcapacitive sensing techniques.

As one example, when using absolute capacitive techniques the sensor electrodes 310 and 330 may be modulated with respect to a reference voltage and the resulting voltage levels on electrodes are used to determine changes in absolute capacitance. In such a usage, the sensor electrodes 310 are configured to sense input object position and/or motion in the "X direction", and sensor electrodes 330 are configured to sense input object position and/or motion in the "Y direction", although such labels are largely arbitrary. In such an embodiment the sensor electrodes 310 would typically be modulated and voltages at the electrodes 310 measured, and then sensor electrodes 330 would similarly be modulated and voltages at the electrodes 330 measured. Such a procedure will result in a set or "profile" of voltage measurements for the X direction and a set or "profile" of voltage measurements for the Y direction. The presence of conductive objects such as fingers changes these X and Y profiles, and thus the profiles can be analyzed to determine the position information for such objects in the sensing region. Specifically, multiple capacitive profiles may be acquired over multiple time periods, and differences between them used to derive information about input in the sensing region. For example, successive capacitive profiles acquired over successive periods of time can be used to track the motion(s) of one or more input objects entering, exiting, and within the sensing region.

Then, when using transcapacitive techniques the sensor electrodes 310 may be used as receiver electrodes and sensor electrodes 330 are configured as transmitter electrodes. In such embodiments the transmitter sensor electrodes 330 may be modulated relative to a reference voltage (e.g., system ground) to transmit transmitter signals, while receiver sensor electrodes 310 are held substantially constant relative to the reference voltage to facilitate receipt of resulting signals. The resulting signals received on receiver sensor electrodes 310 comprise effect(s) corresponding to one or more transmitter signals. By selectively transmitting from transmitter sensor electrodes 330 and receiving resulting signals using receiver sensor electrodes 310, the sensor electrodes 310 and 330 use transcapacitive sensing to sense input object position in both the X and Y directions.

Sensor electrodes 310 and 330 are typically ohmically isolated from each other. That is, one or more insulators separate sensor electrodes 310 and 330 and prevent them from electrically shorting to each other. In some embodiments, sensor electrodes 310 and 330 are separated by insulative material disposed between them at cross-over areas; in such constructions, the sensor electrodes 310 and/or sensor electrodes 330 may be formed with jumpers connecting different portions of the same electrode. In some embodiments, sensor electrodes 310 and 330 are separated by one or more layers of insulative material. In some other embodiments, sensor electrodes 310 and 330 are separated by one or more substrates; for example, they may be disposed on opposite sides of the same substrate, or on different substrates that are laminated together. The capacitive coupling between the transmitter electrodes and receiver electrodes change with the proximity and motion of input objects in the sensing region associated with the transmitter electrodes and receiver electrodes.

In a one embodiment, during transcapacitive sensing the sensor pattern is "scanned" to determine the capacitive couplings between transmitter and receiver electrodes. That is, the transmitter electrodes are driven to transmit transmitter signals and the receiver electrodes are used acquire the resulting signals. The resulting signals are then used to determine measurements of the capacitive couplings between electrodes, where each capacitive coupling between a transmitter electrode and a receiver electrode provides one "capacitive pixel". A set of measured values from the capacitive pixels form a "capacitive image" (also commonly referred to as a "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

It should be noted the embodiment illustrated in FIG. 3 is just one example of the type of electrodes that can be used in the multiple sensing regimes of the various embodiments. Furthermore, it should be noted that while the use absolute capacitive sensing is described as being used to determine capacitive X and Y profiles, that this is just one example. For example, absolute capacitive sensing could be used to determine an image of sensing data, or data in other coordinate systems (e.g., polar coordinates). Likewise, while the use of transcapacitive sensing is described as being used to generate rectangular array of capacitive values images that, this is just one example.

Figure 4:
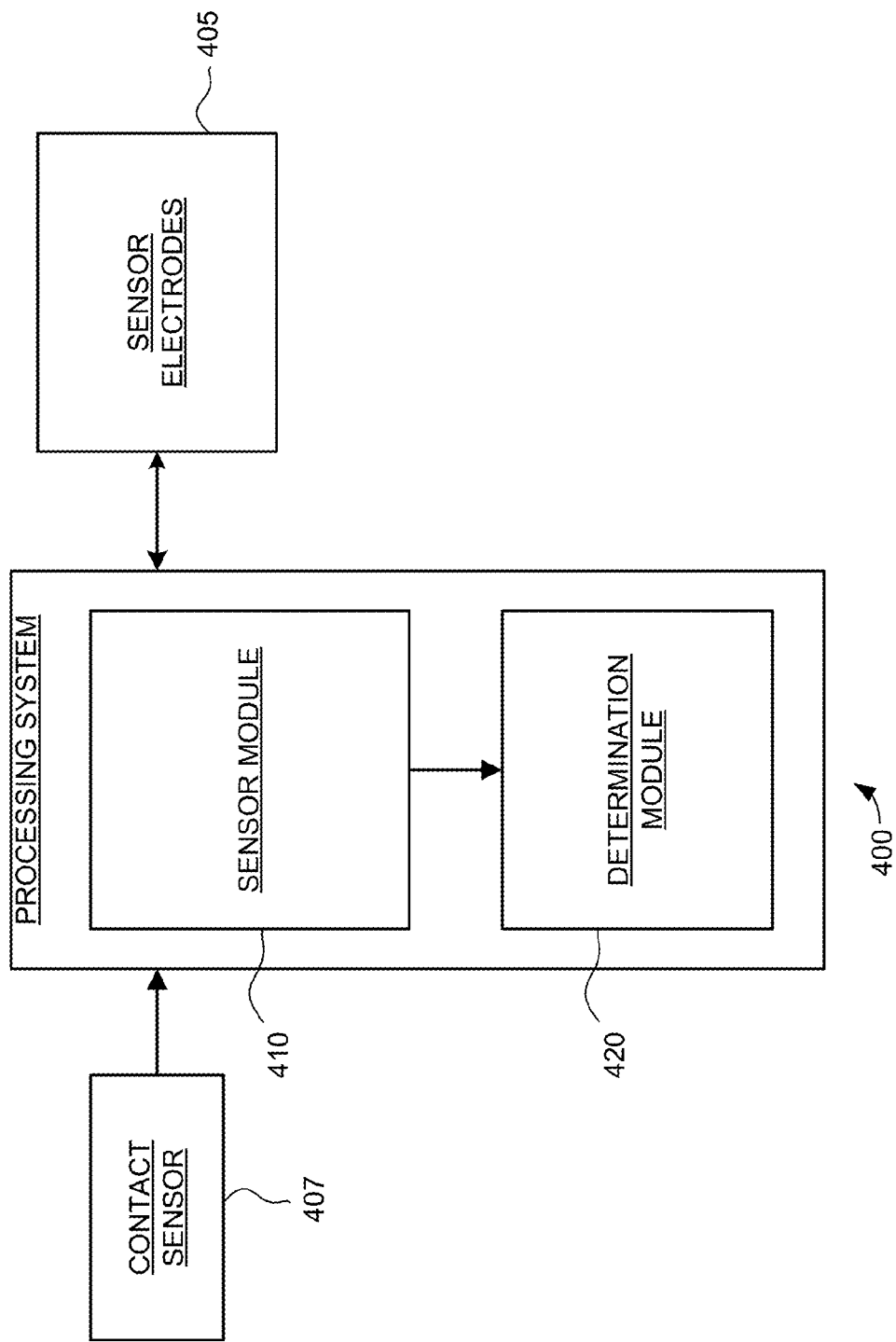
FIG. 4 is a conceptual block diagram depicting a processing system in accordance with an embodiment of the invention.

Referring now to the conceptual block diagram depicted in FIG. 4, one embodiment of an exemplary processing system 110 as shown in FIG. 1 may include a system 400. System 400, as illustrated, generally includes sensor module 410 configured to operate the capacitive sensor electrodes (or simply "electrodes") 405 and a determination module 420. The processing system 400 is also communicatively coupled to a contact sensor 407. In accordance with the embodiments described herein, the sensor module 410 is configured to operate in different sensing regimes with different duty cycles of absolute and transcapacitive sensing. And as such, the sensor electrodes 405 are configured to be used both as absolute capacitive sensor electrodes and transcapacitive sensor electrodes. During transcapacitive sensing some sensor electrodes 405 are used as transmitter electrodes and some sensor electrodes 405 are used as receiver electrodes. It should be noted that not all of the sensor electrodes 405 must be used as either transmitter electrodes or receiver electrodes. Furthermore, the particular sensor electrodes used as transmitter sensor electrodes and receiver electrodes may be dynamically varied with different sensing regimes. The sensor module 410 may operate the sensor electrodes 405 to sense input in a particular region of the sensing region of the input device. For example, processing system may operate in a sensing regime where only half of the sensing region is scanned for input objects. Finally, the sensor module 410 may operate the sensor electrodes 405 in different groupings to sense input in the sensing region. For example, the sensor module may sequentially scan the sensing region, electrode by electrode (in an absolute sensing regime) or pixel by pixel (in a transcapacitive sensing regime), or scan the sensor electrodes 405 or pixels in groups or sections, obtaining limited or coarse, profiles and images which may benefit in rapid detection of input objects near or on the sensing surface.

Sensor module 410 and determination module 420 may include any combination of hardware and/or software configured to operate the sensor electrodes 405 in different sensing regimes. This may include any combination of hardware and/or software for modulating electrodes in sensor electrodes 405 with respect to a reference voltage and measuring resulting voltage levels to determine changes in absolute capacitance. This may also include any combination of hardware and/or software for transmitting signals with transmitter electrodes and receive resulting signals with receiver electrodes to perform transcapacitive sensing.

In these embodiments the sensor module 410 may be determined to provide the transmitter signals in a variety of formats. For example, the transmitter signals may comprise any one of a sinusoidal waveform, square waveform, triangular waveform, sawtooth waveform or the like.

As noted above, the sensor module 410 and determination module 420 also may include any combination of hardware and/or software needed to switch between absolute capacitive sensing and transcapacitive sensing. In particular, the sensor module 410 may include any combination of hardware and/or software needed to operate in two different sensing regimes with different duty cycles of absolute and transcapacitive sensing. For example, to operate in a first sensing regime that comprises a first duty cycle of absolute capacitive sensing and a first duty cycle of transcapacitive sensing, and to operate in a second sensing regime that comprises a second duty cycle of absolute capacitive sensing and a second duty cycle of transcapacitive sensing.

The term "duty cycle" in this context refers to the portion of time spent sensing with a particular sensing type. Thus, as one example, the first sensing regime could comprise 10 percent absolute capacitive sensing (i.e., a duty cycle of 10 percent) and 90 percent transcapacitive sensing (i.e., a duty cycle of 90 percent). Similarly, the second sensing regime could comprise 60 percent absolute capacitive sensing (i.e., a duty cycle of 60 percent) and 40 percent transcapacitive sensing (i.e., a duty cycle of 40 percent). It should be noted that such duty cycles could be quantified by the time spent sensing in each type, by the number of sensing cycles for each type, or in any other suitable way. Furthermore, it should be noted that such duty cycles could be accomplished using any suitable protocol for determining the order and arrangement of the types of switching performed. Thus, a 90 percent duty cycle of absolute capacitive sensing could be accomplished switching between 180 cycles of absolute capacitive sensing followed by 20 cycles of transcapacitive sensing. Alternatively, the same duty cycle may be accomplished with 9 cycles of absolute sensing followed by one cycle of transcapacitive sensing. Finally, it should be noted that a sensing regime could have a full 100 percent duty cycle of a type of sensing. Thus, a sensing regime could comprise 100 percent of one type of sensing and 0 percent of another type. In one embodiment a sensing regime may comprise nearly 100 percent duty cycle of absolute capacitive sensing, with only periodic transcapacitive sensing performed to capture nominal baseline values of a background capacitance, commonly referred to as "baseline measurements". However, in many typical embodiments one or both of the first and second sensing regimes will include both non-zero duty cycles of both absolute and transcapacitive sensing. For embodiments that include nearly 100 percent duty cycle of a type of sensing it would typically be desirable to perform sufficient sensing of the types needed to maintain an accurate baseline measurement.

It should be noted that in addition to including duty cycles of transcapacitive and/or absolute capacitive sensing, each sensing regime may include other duty cycles where other actions are taken. For example, during some portion of time in the sensing regime no sensing may occur. In such an example the sensing regime would thus comprise an additional duty cycle of "non-sensing" where the device is not capacitively sensing for input objects. Including such duty cycles of non-sensing may done for a variety of reasons, including to reduce power consumption and/or data processing requirements. As one specific example, a sensing regime may comprise 40 percent absolute capacitance sensing and 60 percent of non-sensing. In another example, a first sensing regime may comprise 60 percent transcapacitive sensing, 10 percent absolute capacitive sensing, and 30 percent non-sensing. In another example, a second sensing regime may comprise 70 percent absolute capacitive sensing, and 25 percent non-sensing, and 5 percent transcapacitive sensing.

In the illustrated embodiment, determination module 420 includes any combination of hardware and/or software configured to determine positional information for input objects in the sensing region using multiple sensing regimes. As described above, this can involve receiving sensor values from the sensor module 410 and processing those sensor values. The sensor values may comprise values from measuring voltages on electrodes when performing absolute capacitive sensing, and values from receiving resulting signals when performing transcapacitive sensing. These sensor values can then processed and analyzed to determine position information for input objects. This processing can involve the use of various stored baselines, threshold values and various types of filtering. Furthermore, this processing can include techniques used to locate objects based on the resulting signals. For example, by using curve fitting or interpolation and spatial correlation techniques. Determination module 420 is thus configured to then determine positional information for an input object (e.g., input object 140 in FIG. 1) based on the measurements.

The determination module 410, like the processing system 400 in general, is adapted to selectively operate in at least two different sensing regimes. In some embodiments, a first sensing regime is adapted to determine position information for objects at the surface of the input device 100, while a second sensing regime is adapted to determine position information for objects that are away from the surface, such as gloved or hovering fingers. To facilitate this, the determination module 410 is adapted to process sensor values generated from different duty cycles of absolute and transcapacitive sensing in the first and second sensing regimes. In some embodiments of the determination module 410, other features may differentiate the first sensing regime and the second sensing regime. Like the relative duty cycles, these other features may provide increased performance for determining object position for objects at the surface when using the first sensing regime, while providing increased performance for determining object position for objects away from the surface when using the second sensing regime. As specific examples, the determination module 410 can utilize different resulting signal gains, perform different filtering operations on resulting signals, manage different baseline values and sensitivity thresholds in the different sensing regimes. The determination module 410 can also use different techniques for determining positional information from measured sensor values in the different sensing regimes. For example, the determination module 410 can use curve fitting of resulting signals for objects at the surface, and spatial correlation of resulting signals for determining object position for objects away from the surface.

For example, the processing system 400 can be adapted to filter signals received from the sensor electrodes to improve the accuracy of the resulting position determination. In accordance with the embodiments described here, the processing system 400 can be adapted to utilize different types or levels of filtering for the different sensing regimes. As a specific example, the processing system can be configured to filter resulting signals at a first level of fidelity in the first sensing regime, and filter resulting signals at a second level of fidelity in the second sensing regime. In such embodiments it will generally be desirable for the first level of fidelity to be greater than the first, such that the first sensing regime utilizes more aggressive filtering to remove noise and interference. This allows for improved accuracy of position determination in the first sensing regime, while the less aggressive filtering in the second sensing regime again facilities increased sensing range from the surface.

As another example, the processing system 400 can be adapted to utilize different baseline acquisition procedures for the first and second sensing regimes. A typical capacitive sensor uses a baseline measurement of signals associated with each electrode in the array of electrodes when no input is present in the sensing region. To maintain baseline accuracy, the sensor device periodically measures the signals associated with each electrode, and determines an appropriate baseline offset for each electrode, with the baseline offsets selected such that all of the electrodes measure from the same common baseline. These measurements preferably occur when no object is close enough to interfere with the calculation of the baseline offsets. However, these measurements also preferably occur sufficiently often enough to keep the device properly calibrated. In accordance with the embodiments described herein, the processing system 400 can use different baseline procedures for the first and second sensing regimes. For example, different baseline values can be determined and used for the different regimes. Likewise, different baseline values can be determined and used for absolute and transcapacitive sensing. As another example, the first sensing regime can be implemented with a first duty cycle of baseline acquisition, and the second sensing regime implemented with a second duty cycle of baseline acquisition, where the first duty cycle is greater than the second duty cycle. Furthermore, the baseline management procedures may comprise using a recently acquired measurement to "adjust a stored baseline. In such a manner, changes in the baseline measurement can be merged with a stored baseline. Adjusting a stored baseline, by incorporating new baseline measurement, may occur more or less rapidly in different sensing regimes. For example, in one embodiment, baseline acquisition in a first sensing regime may use a recently acquired baseline to override (e.g. replace) any stored baseline values, while a second sensing regime may use a recently acquired baseline to partially update any stored baseline values. For example, a stored baseline measurement and recently acquired baseline measurement may be merged to a new stored baseline by weighting the stored or recently acquired baseline measurements. In one embodiment, a "fast" baseline acquisition may override or heavily weigh the recently acquired baseline measurement compared to the stored baseline measurement. A "slow" baseline acquisition may weigh the newly acquired baseline measurement in a manner which updates the stored baseline measurement such that any differences between the two measurements are only partially incorporated in the new stored baseline measurement.

The processing system 400 can also utilize different techniques for determining positional information from measured sensor values in the different sensing regimes. For example, the processing system 400 can use interpolation in the first sensing regime for determining object position for objects at the surface, and can use spatial correlation in the second sensing regime for determining object position for objects away from the surface. In such an embodiment, the position detection procedures are adapted to determine positional information from resulting signals containing contacting and non-contacting input objects. For example, a contacting input object typically provides resulting signals which are better suited for performing local interpolation to determine object positions. A hovering input object typically provides resulting signals which are more dynamic in nature and better suited for spatial correlation to determine input object positions.

As described above, the various embodiments utilize two sensing regimes, with one sensing regime designed to more accurately sense objects at the surface, and the other sensing regime designed to have greater range to allow for sensing of objects away from the surface, such as a gloved or hovering fingers. In most devices it will be desirable to switch between operating in these sensing modes based on the type of input expected to be used. Such a switch can be made based on a variety of information. For example, the processing system 400 may switch sensing regimes based on contact information for one or more objects in the sensing region. This contact information may be derived from the sensor electrodes or may be derived from additional sensors of the input device or electronic system. In such implementations, the device may default to one sensing regime, and switch to another sensing regime based on the occurrence or non-occurrence of contact on the sensing surface. For example, the processing system 400 could default to the second sensing regime to provide long range sensing and then switch to the first sensing regime in response to determined contact with the sensing surface. In such an embodiment it may be desirable to distinguish between conductive and non-conductive objects, such that the sensing regime is switched only in response to a conductive object touching the touch surface. This would help distinguish between actual attempts at user input compared to inadvertent contact with other objects. This could also be used to enhance gloved finger detection, by modifying a sensing regime based on the contact information. For example, resulting signals from absolute and/or transcapacitive sensing cycles may indicate a gloved finger input. Furthermore, a contact sensor may provide information regarding contact on the input surface to help improve accurate input object determination. Based on the determination that a gloved input is present on the sensing surface, the processing system may operate in a mode comprising an increased duty cycle of transcapacitive sensing and further reduce or modify its sensitivity thresholds to detect the gloved input object.

In any of these embodiments it may be desirable to switch back to the second sensing regime when contact has not been detected for some period of time. This again makes the second, longer range sensing regime the default sensing regime to facilitate detection of hovering objects and approaching fingers. In some embodiments, it may be desirable to alternate between the first and second sensing regimes to determine input object information for multiple types of input objects in the sensing region. For example, to determine positional information for a first contacting input and a second hovering input.

In other devices it may be desirable to use the first sensing regime as a default regime to most accurately sense objects at the surface, but then to switch to the second sensing regime when it is likely that objects are being used away from the surface for input. In such embodiments there can be some difficulty in making such a switch, as such hovering objects are not likely to be reliably detected when using the first sensing regime. As noted above, this may be addressed by switching to the first regime when no contact has been detected for some time period or to periodically alternate between the first and second sensing regimes. In other embodiments it may be desirable to provide various mechanisms and techniques for a user to indicate that the device should switch to the second sensing regime. In such embodiments the processing system 400 can be implemented to switch sensing regimes in response to a variety of factors. For example, when a separate mechanical switch is activated.

Turning now to FIG. 5, a state diagram 500 illustrates an exemplary switching procedure between sensing regimes. The state diagram 500 includes a first regime 502, a second regime 504, a detection regime 506, and transitions T1-T5. As described above, the first sensing regime 502 may be implemented to sense objects at a surface, while the second sensing regime is implemented to have greater range to facilitate sensing objects away from the surface (e.g., hovering or gloved fingers). To provide such sensing, the first sensing regime may use a first duty cycle of absolute capacitive sensing and a first duty cycle of transcapacitive sensing. The second sensing regime may likewise use a second duty cycle of absolute capacitive sensing and a second duty cycle of transcapacitive sensing, where the second duty cycle of absolute capacitive sensing is greater than the first duty cycle of absolute capacitive sensing.

In this embodiment the detection regime 506 may be implemented to provide sensing that can be used to determine which of the first sensing regime 502 and second sensing regime 504 the input device should be operated when an input object is detected. As such, detection regime 506 would be implemented to detect both objects at and away from the surface. In one example, this can be implemented by operating the detection regime with an intermediate duty cycle of absolute capacitive sensing and an intermediate duty cycle of transcapacitive sensing, where such intermediate duty cycles are between the respective first and second duty cycles. Additionally, as other examples, the detection regime 506 can utilize different resulting signal gains, perform different filtering operations on resulting signals, manage different baseline values and sensitivity thresholds. Finally, the detection regime 506 can be implemented to utilize information from one or more contact sensors. Thus, in each of these various ways the detection regime 506 may be implemented to detect both contacting and hovering objects to facilitate the correct transition to the first sensing regime 502 and the second sensing regime 504.

As noted above, the state diagram 500 includes transitions T1-T5. The transition T1 transitions from the detection regime 506 to the first regime 502. A variety of criteria can be used to initiate such a transition T1. As one example, the transition T1 may be implemented to transition from the detection regime 506 to the first regime 502 when contact on the sensing surface is detected. Such contact information may be derived from the sensor electrodes or may be derived from additional contact sensors. In such an embodiment it may be desirable to distinguish between conductive and non-conductive objects, such that the transition T1 occurs only in response to a conductive object touching the touch surface. Again, this would be used to distinguish between actual attempts at user input compared to inadvertent contact with other objects. As another example, the transition T1 may be implemented to transition from the detection regime 506 to the first regime 502 when changes in resulting signals beyond a threshold level are detected. For examples, when resulting signals are detected that are highly indicative of a conductive object at the surface.

The transition T2 transitions back from the first regime 502 to the detection regime 506. A variety of criteria can be used to initiate such a transition T2. In general, criteria would be selected that are indicative of an input object having left the surface and no longer being detected. For example, when a substantial change in resulting signals associated with an input object occurs. Additionally, one or more contact sensors could be utilized. In some cases it may desirable to initiate the transition T2 only when such a substantial change occurs for a period of time to avoid prematurely switching from the first sensing regime 502.

The transition T3 transitions from the detection regime 506 to the second regime 504. Again, a variety of criteria can be used to initiate such a transition T3. As one example, the transition T3 may be implemented to transition from the detection regime 506 to the second regime 502 when resulting signals indicative of a hovering or gloved object are detected. For example, when intermediate amounts of change in resulting signals are detected. Additionally, the transition T3 may use criteria such as a measure of resulting signal stability, a measure of positional stability and/or a measure of size. Again, such criteria would be selected to distinguish between actual hovering or gloved objects and inadvertent proximity to other objects.

The transition T4 transitions back from the second regime 504 to the detection regime 506. A variety of criteria can be used to initiate such a transition T4. In general, criteria would be selected that are indicative of an input object no longer hovering over the surface, or when a gloved object is no longer at the surface. For example, when a substantial change in resulting signals associated with a hovering or gloved input object occurs. In some cases it may be desirable to initiate the transition T4 only when such a substantial change occurs for a period of time to avoid prematurely switching from the second sensing regime 504.

The transition T5 transitions from the second regime 504 to the first regime 502. A variety of criteria can be used to initiate such a transition T5. Similar to the transition T1, the transition T5 may be implemented to may be implemented to transition to the first regime 502 when contact on the sensing surface is detected. Such contact information may be derived from the sensor electrodes or may be derived from additional contact sensors. In such an embodiment it may be desirable to distinguish between conductive and non-conductive objects, such that the transition T5 occurs only in response to a conductive object touching the touch surface. As another example, the transition T5 may be implemented to transition when changes in resulting signals beyond a threshold level are detected.

Returning to FIG. 4, as noted above, a variety of different techniques and devices can be used to determine contact information for the input device. In some embodiments, the capacitive sensor electrodes themselves can be used to detect contact. This can be accomplished using a variety of techniques, including those that use the capacitive sensor electrodes to detect deflection and or force applied to the touch surface. Examples of such techniques are described below.

In some embodiments, resulting signals from the capacitive sensor electrodes may be used to determine contact information for objects in the sensing region. Such a determination may be made based on the rate of the change of the received sensor signals. For example, contact of an object may be reliably inferred when the slope of change in the received sensor signals rises then goes to near zero. In such an embodiment the rise is indicative of a finger or other conductive object getting closer, while the leveling out of the slope indicates that the finger or other object has stopped moving closer. Thus, it may be inferred that the object has contacted the touch surface, or is at a minimum hovering close the surface. In another example, resulting signals for a hovering input object, especially in the second sensing regime, will change dramatically if the hovering input object contacts the touch surface. Determining a rapid increase in the magnitude of the resulting (along with the shape and stability of the resulting signals) may indicate a contacting input object. Other examples of input devices configured to determine contact information based on resulting signal analysis can be in found in U.S. Patent Publication No. 20120146935, entitled "System and Method for Determining Object Information using an Estimated Rigid Motion Response; U.S. Patent Publication No. 20120120017, entitled "System and Method for Determining Object Information using an Estimated Deflection Response; and U.S. patent application Ser. No. 13/434, 608, entitled "System and Methods for Determining Object Information Using Selectively Floated Electrodes, filed Mar. 29, 2012.

In the illustrated embodiment the processing system 400 is coupled to a contact sensor 407. Contact sensor 407 is an example of the type of additional sensors that can be utilized to determine contact information for objects in the sensing region. Again, in these embodiments it may be desirable to the use the second sensing regime with its longer sensing range as a default regime, and then switch to the first sensing regime when based on contact signals provided by the contact sensor (s). In some embodiments a variety of different types of contact sensors 407 may be used. For example, a separate force sensor coupled to the touch surface and the processing system can be used to provide contact information. An infrared or optical sensor configured to monitor input objects contacting the touch surface and coupled to the processing system can be used to provide contact information. Examples of various contact sensors 407 can be found in U.S. Patent Publication No. 20100253645, entitled "Input Device with Capacitive Force Sensor and Method for Constructing the Same; and U.S. Patent Publication No. 20110278078, entitled "Input Device with Force Sensing".

In other embodiments, a variety of input gestures can be implemented to allow a user to initiate a switch to second sensing regime. In some cases such gestures may require the identification of specific types of input, or at specific locations on the input device.

As one specific example, the processing system 400 can be implemented to switch to the second sensing regime responsive to a determination that resulting signals from the sensor electrodes meets a set of criteria, where the set of criteria includes various factors such as: an input object being proximate a region of the display screen (e.g. a displayed unlock icon image); a measure of resulting signal stability corresponding to the input object meeting a stability threshold level; a measure of the resulting signal value amplitude(s) corresponding to the input object being below a high threshold level and above a low threshold level; a measure of positional stability corresponding to the input object meeting a positional stability threshold level; and/or a measure of size corresponding to the input object meeting a size threshold level. So implemented, the input device allows a user to easily switch between two different sensing regimes, and thus can facilitate the use of the device with both gloved and ungloved fingers providing input. For more details on such an embodiment, see U.S. patent application Ser. No. 13/536.776, entitled "Systems and Methods for Switching Sensing Regimes for Gloved and Ungloved User Input, filed on Jun. 28, 2012.

In embodiments with a separate contact sensor (such as contact sensor 407 in FIG. 4), such as force or optical sensor described above, the additional contact information may be used to determine if a position offset exists between the sensed location of an object, and the contact location. Such a position offset may occur when a user touches the touch surface with a fingernail. Because fingernails are not conductive, the capacitively detected position of the fingertip will be different then the contact position of the fingernail. In embodiments where the contact sensor can be used to determine the position of the fingernail contact, this positional "offset" between fingertip and fingernail can be used to provide additional functionality. For example, it may that a user wishes to make input based on the position of the fingernail. The offset value can then be used to provide offset position information to the system, allowing such inputs to be made based on the position of the fingernail and not just the finger tip. For example, a contact sensor may determine positional information for the input objects which is different from the positional information determined by the proximity sensor. An offset may be determined from the difference in positional information.

The embodiments described herein thus provide devices and methods that facilitate improved input devices. Specifically, the devices, systems and methods provide the ability to accurately determine user input using multiple different sensing regimes. The different sensing regimes can be used to facilitate accurate position determination of objects both at the surface and away from the surface. For example, the different sensing regimes can be used to determine position information for both ungloved and gloved fingers. As another example, the different sensing regimes can be used to determine position information for both touching and hovering objects. In one embodiment the first sensing regime uses a first duty cycle of absolute capacitive sensing and a first duty cycle of transcapacitive sensing. The second sensing regime uses a second duty cycle of absolute capacitive sensing and a second duty cycle of transcapacitive sensing, where the second duty cycle of absolute capacitive sensing is greater than the first duty cycle of absolute capacitive sensing.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system for an input device comprising:
   a sensor module comprising sensor circuitry, the sensor module configured to:
      operate a plurality of capacitive sensor electrodes to selectively perform transcapacitive sensing and absolute capacitive sensing to detect objects in a sensing region; and
   a determination module configured to:
      determine positional information for input objects in the sensing region by selectively operating the processing system in a first sensing regime and a second sensing regime based on contact information for input objects in the sensing region; wherein
         the first sensing regime comprises a first duty cycle of absolute capacitive sensing and a first duty cycle of transcapacitive sensing; and
         the second sensing regime comprises a second duty cycle of absolute capacitive sensing and a second duty cycle of transcapacitive sensing, where the second duty cycle of absolute capacitive sensing is greater than the first duty cycle of absolute capacitive sensing.

2. The processing system of claim 1, wherein the determination module is further configured to determine a positional offset for an input object in the sensing region by determining a difference in a position determined using the plurality of capacitive sensor electrodes and a position determined by a contact sensor.

3. The processing system of claim 1, wherein the sensor module is further configured to: perform a filtering operation on resulting signals from the plurality of capacitive sensor electrodes; and wherein the first sensing regime further comprises filtering the resulting signals at a first level and the second sensing regime further comprises filtering the resulting signals at a second level.

4. The processing system of claim 1, wherein the first sensing regime further comprises a first duty cycle of baseline acquisition and the second sensing regime further comprises a second duty cycle of baseline acquisition, wherein the first duty cycle of baseline acquisition is greater than the second duty cycle of baseline acquisition.

5. The processing system of claim 1, wherein the contact information for input objects in the sensing region comprises a determination that an input object is contacting a touch surface and is determined using at least one of the plurality of capacitive sensor electrodes and a contact sensor.

6. The processing system of claim 1, wherein the contact information for input objects in the sensing region is determined using a contact sensor, and wherein the contact sensor comprises a force sensor coupled to a touch surface and the processing system.

7. The processing system of claim 1, wherein the processing system is configured to determine the contact information for input objects contacting a touch surface using a determined rate of change of a sensing signal.

8. The processing system of claim 1, wherein a number of sensor electrodes simultaneously driven with a sensing signal in the second sensing regime is greater than in the first sensing regime.

9. The processing system of claim 1, wherein the determination module is configured to determine positional information from absolute capacitive measurements using a spatial correlation and from transcapacitive measurements using interpolation.

10. The processing system of claim 1, wherein the determination module is further configured to:
    determine a type of an input object in the sensing region using the plurality of capacitive sensor electrodes; and
    modify a sensing regime based on the determined type of input in the sensing region.

11. A method for determining positional information for input objects in a sensing region, comprising:
    selectively operating in a first sensing regime and a second sensing regime based on contact information for input objects contacting a touch surface, wherein:
       the first sensing regime comprises a first duty cycle of absolute capacitive sensing between capacitive sensor electrodes and an input object in the sensing region, and a first duty cycle of transcapacitive sensing between capacitive sensor electrodes; and
       the second sensing regime comprises a second duty cycle of absolute capacitive sensing and a second duty cycle of transcapacitive sensing, where the second duty cycle of absolute capacitive sensing is greater than the first duty cycle of absolute capacitive sensing; and
    determining positional information for input objects in the sensing region using at least one of the first sensing regime and the second sensing regime.

12. The method of claim 11, wherein the first sensing regime further comprises filtering resulting signals obtained in the first sensing regime at a first level of fidelity and the second sensing regime further comprises filtering resulting signals obtained in the second sensing regime at a second level of fidelity, wherein the first level of fidelity is greater than the second level of fidelity.

13. The method of claim 11, wherein the contact information for input objects in the sensing region comprises a determination that a conductive input object is contacting the touch surface and wherein the contact information for input objects in the sensing region is determined using at least one of the capacitive sensor electrodes and a contact sensor.

14. The method of claim 11, wherein a number of the capacitive sensor electrodes simultaneously driven with a sensing signal for sensing in the second sensing regime is greater than in the first sensing regime.

15. The method of claim 11, wherein the determining positional information for input objects in the sensing region using the first sensing regime and the second sensing regime comprises using an interpolation technique on resulting signals obtained in the first sensing regime and using a spatial correlation technique on resulting signals obtained in the second sensing regime.

16. An input device comprising:
a touch surface overlapping a display;
a plurality of capacitive sensor electrodes; and
a processing system coupled to the plurality of capacitive sensor electrodes, the processing system configured to:
perform transcapacitive sensing between electrodes in the plurality of capacitive sensor electrodes;
perform absolute capacitive sensing between electrodes in the plurality of capacitive sensor electrodes and an input object a sensing region of the input device;
selectively operate in a first sensing regime and a second sensing regime based on contact information for input objects in the sensing region, wherein:
the first sensing regime comprises a first duty cycle of absolute capacitive sensing and a first duty cycle of transcapacitive sensing; and
the second sensing regime comprises a second duty cycle of absolute capacitive sensing and a second duty cycle of transcapacitive sensing, where the second duty cycle of absolute capacitive sensing is greater than the first duty cycle of absolute capacitive sensing; and
determine positional information for input objects in the sensing region using the first sensing regime and the second sensing regime.

17. The input device of claim 16, wherein the processing system is further configured to: perform a filtering operation on resulting signals from the plurality of capacitive sensor electrodes; and wherein the first sensing regime further comprises filtering the resulting signals at a first level of fidelity and the second sensing regime further comprises filtering the resulting signals at a second level of fidelity, wherein the first level of fidelity is greater than the second level of fidelity.

18. The input device of claim 16, wherein the contact information for input objects in the sensing region comprises a determination that a conductive input object is contacting the touch surface of the input device wherein the contact information for input objects in the sensing region is determined using at least one of the plurality of capacitive sensor electrodes and a contact sensor.

19. The input device of claim 16, wherein a number of sensor electrodes simultaneously driven with a sensing signal for sensing in the second sensing regime is greater than in the first sensing regime.

20. The input device of claim 16, wherein the processing system is configured to determine positional information from absolute capacitive measurements using a spatial correlation technique and from transcapacitive measurements using an interpolation technique.

* * * * *